United States Patent [19]

Smith

[11] 4,025,364

[45] May 24, 1977

[54] PROCESS FOR SIMULTANEOUSLY FABRICATING EPITAXIAL RESISTORS, BASE RESISTORS, AND VERTICAL TRANSISTOR BASES

[75] Inventor: Peter R. Smith, San Jose, Calif.

[73] Assignee: Fairchild Camera and Instrument Corporation, Mountain View, Calif.

[22] Filed: Aug. 11, 1975

[21] Appl. No.: 603,402

[52] U.S. Cl. .................. 148/1.5; 148/175; 148/187
[51] Int. Cl.² ................................ H01L 21/265
[58] Field of Search .............. 148/1.5, 187, 175

[56] References Cited

UNITED STATES PATENTS

| 3,383,567 | 5/1968 | King et al. ................. 148/1.5 X |
| 3,648,125 | 3/1972 | Peltzer ......................... 148/187 X |
| 3,756,861 | 9/1973 | Payne et al. ................... 148/1.5 |
| 3,756,862 | 9/1973 | Ahn et al. ..................... 148/1.5 |
| 3,775,192 | 11/1973 | Beale ............................ 148/1.5 |

Primary Examiner—L. Dewayne Rutledge
Assistant Examiner—J. M. Davis
Attorney, Agent, or Firm—Alan H. MacPherson; Henry K. Woodward; Norman E. Reitz

[57] ABSTRACT

A process for simultaneously fabricating epitaxial resistors, base resistors, and vertical transistor bases in a semiconductor substrate utilizes the stopping power of different layers of materials to determine the location of impurity concentrations induced by ion implantation.

5 Claims, 4 Drawing Figures

PROCESS FOR SIMULTANEOUSLY FABRICATING EPITAXIAL RESISTORS, BASE RESISTORS, AND VERTICAL TRANSISTOR BASES

BACKGROUND OF THE INVENTION

1. Field of the Invention

This invention relates to semiconductor devices, and in particular to a method of simultaneously forming epitaxial resistors, base resistors, and vertical transistor bases in integrated circuit structures.

2. Prior Art

Oxide isolated integrated circuit structures are well known and have been employed in integrated circuit technology for a substantial period. See e.g., U.S. Pat. No. 3,648,125 entitled "Method of Fabricating Integrated Circuits with Oxidized Isolation and the Resulting Structure" issued March 7, 1972, to Douglas Peltzer, and referred to hereinafter as the Peltzer patent. Equally well known are techniques for fabricating epitaxial resistors, base resistors, and vertical transistor bases. See also the Peltzer patent.

Rather than utilize ion implantation techniques of fabrication, the prior art relied primarily upon diffusion processes to produce the desired semiconductor structures. Accordingly, difficulty was often encountered in prescisely positioning the desired quantity and concentration of impurities within a given semiconductor structure. For example, in the fabrication of base resistors it is desirable to have a very high concentration of impurity at the surface of the semiconductor structure so excellent ohmic contact may be made to the base resistor. It is also desirable, however, when fabricating high resistivity base resistors, to have low impurity concentrations within the body of the base resistor, as it is well known that resistivity is inversely proportional to impurity concentration. That is, the greater the amount of impurity, the lesser the resistivity. These structures, as formed by prior art processing often have undesirably high concentrations of impurities below the semiconductor substrate surface.

For the same reasons as discussed above in conjunction with base resistors, it is also desirable to have very low impurity concentrations in the body of epitaxial resistors, but high concentrations in the ohmic contact regions. With the process utilized in forming prior art structures it was difficult to obtain the desired concentration profiles. Relatively large amounts of impurity were required to obtain the desired impurity concentration at the surface, with the unattractive secondary result that an undesirable amount of impurity would diffuse into the regions of the structure away form the surface. This excess concentration of impurity within the body of the structure lowered the resistivity.

Prior art technology also relied upon diffusion processes to position impurity concentrations in the active bases of vertical transistors. The present invention provides a technique whereby most of the impurity concentration is placed in the active region below the emitter-base junction. This provides a higher level of beta control than prior art thermal processing.

One frequent problem with many prior art integrated circuit structures was their susceptibility to inversion phenomena. Inversion phenomena are well known in the art of semiconductor manufacture and involve the changing of the surface of semiconductor material form one conductivity type to the opposite type. For example, a low concentration of P type semiconductor material can be inverted to N type material by the inadvertent inclusion of relatively few sodium ions in the oxide covering the material. The present invention avoids this difficulty of prior art devices by providing a high surface doping concentration, but a low total bulk concentration.

Finally, prior art semiconductor fabrication processes required numerous steps to produce a structure having epitaxial resistors, base resistors, and vertical transistor bases. For example, in the Peltzer patent, itself a substantial advance over previous art, several steps were required to define the base contact predeposition region, the regions in which epitaxial resistors would be formed, and the regions in which base resistors would be formed. The present invention circumvents this cumbersome procedure by defining all the above regions with only two masks, and then forming epitaxial resistors, base resistors, and vertical transistor bases simultaneously with a single ion implantation.

SUMMARY OF THE INVENTION

A layer of a first material is formed on a semiconductor substrate, which may be a partially completed integrated cirucit, and then removed form selected regions of the substrate. A layer of second material is formed on the first material and on the semiconductor substrate, and then removed from selected regions of the first material and substrate. Ions of desired type and energy are then allowed to bombard the semiconductor structure as selectively covered by the layers of first and second material. In one preferred embodiment the semiconductor structure is a partially completed integrated circuit, the first material is silicon dioxide, and the second material is a photoresistive mask. Boron ions are then implanted in the structure to simultaneously form epitaxial resistors, base resistors, and vertical NPN transistor bases. Conventional integrated circuit processing completes the integrated circuit by forming emitter regions and ohmic contact surfaces for all desired regions.

BREIF DESCRIPTION OF THE DRAWINGS

FIG. 1 shows a partially completed integrated circuit structure as produced in accord with the Peltzer patent.
FIG. 2a and 2b illustrate the process of this invention.
FIG. 3 shows impurity concentration profiles at various locations in FIG. 2a.

DESCRIPTION OF THE PREFERRED EMBODIMENT

Figure 1:
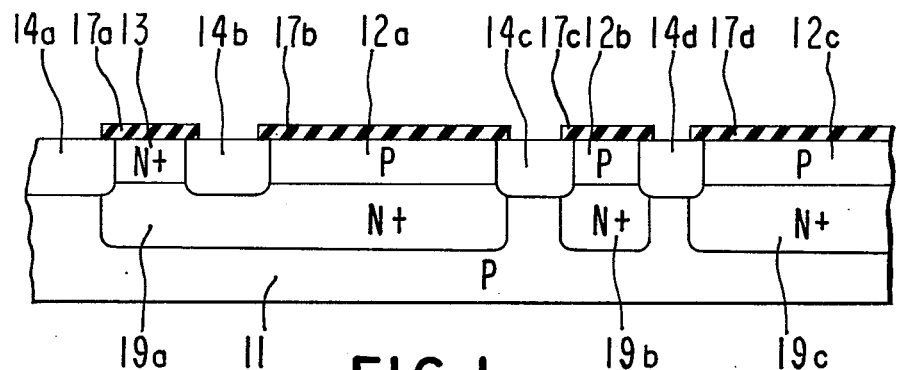

FIG. 1 illustrates a partially completed integrated circuit structure utilizing the oxide isolation technique as described in the Peltzer patent. A detailed explanation of the procedure for fabricating the structure shown in FIG. 1 appears in the Peltzer patent, but will be briefly summarized here. Further, although the description given herein will be in terms of a structure which results in NPN vertical transistors, it should be understood that the process herein described is equally applicable to structures of opposite type semiconductor materials, i.e., PNP transistors, or to semiconductor structures manufactured in accord with other well-known techniques, e.g. nonoxide isolated structures.

The FIG. of FIG 1. is obtained by: Oxidize (not shown) the P substrate 11; mask and diffuse N-type regions 19a, 19b, and 19c which serve as buried collectors, crossunders, and isolation regions;

remove the oxide (not shown) and form a P-type epitaxial silicon layer 12a, 12b, 12c, and 13 (region 13 is later converted to N type material. See below);

deposit and mask a silicon nitride layer 17a, 17b, 17c and 17d;

etch and oxidize isolation regions 14a, 14b, 14c and 14d;

mask and diffuse contacts 13 to the buried layer 19a.

The process of this invention as applied to the structure shown in FIG. 1 or other semiconductor structures allows simultaneous fabrication of epitaxial resistors, base resistors, and vertical transistor bases. This process is applicable to many different semiconductor structures, but will be described in conjunction with the incomplete integrated circuit structure as shown in FIG. 1, following removal of the silicon nitride layer 17a, 17b, 17c, and 17d.

Figure 2A:
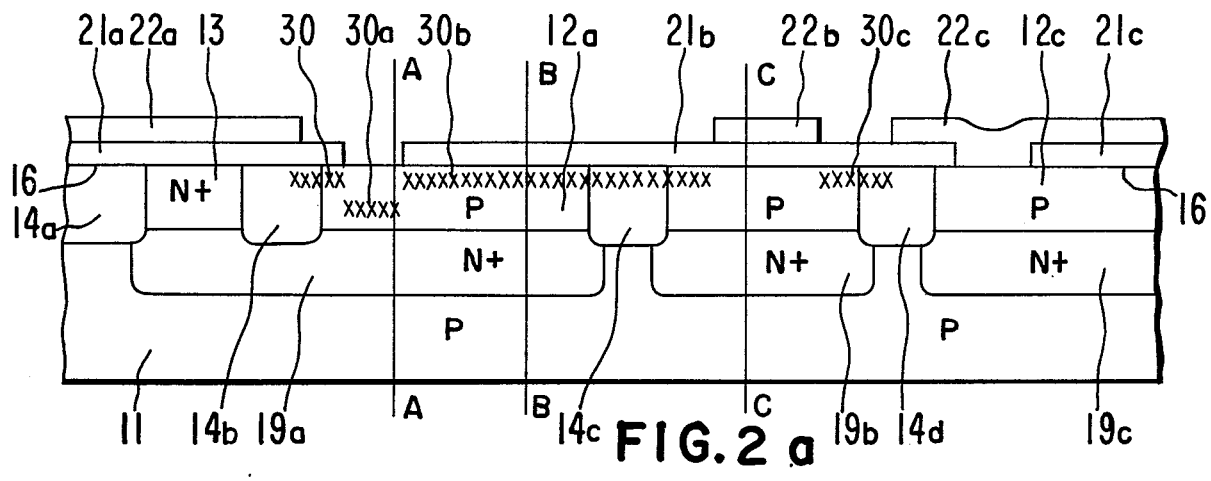
Figure 2B:
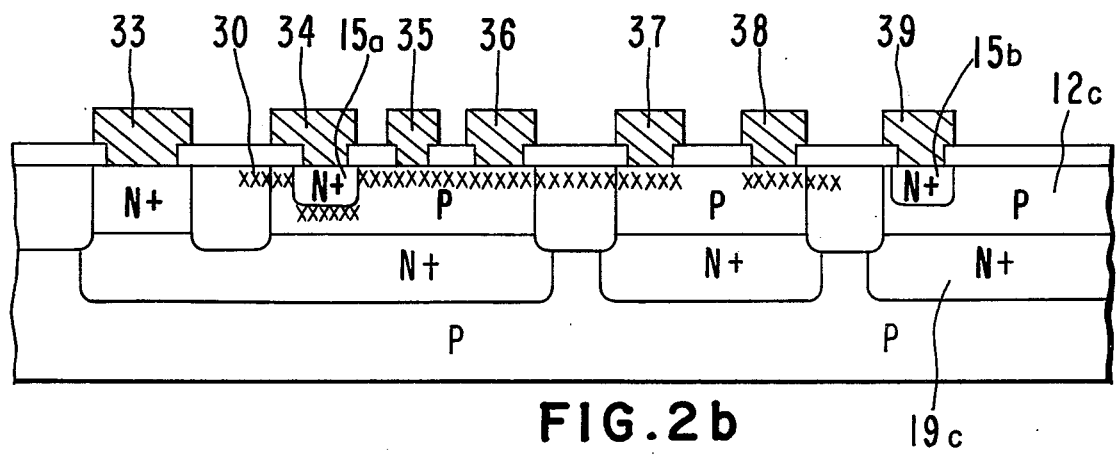

The process of this invention is shown in FIGS. 2a and 2b. First, as shown in FIG. 2a, a layer 21a, 21b, and 21c of first material is formed on the desired surface 16 of a semiconductor substrate. In one embodiment, the first material 21a, 21b, and 21c is silicon dioxide formed by the well-known steam oxidation process, and then removed from selected regions of the substrate by well-known photographic and chemical techniques. Typically, the regions of the substrate surface 16 from which the layer of first material has been removed will be "windows" for subsequent formation of the active bases of vertical transistor structures. These same windows may also serve to define the diffusion of the emitter for the vertical transistor.

Untilization of the same openings in the layer of first selected material 21a, 21b, and 21c for diffusion or ion implantation of the emitter region (FIG. 2b, regions 15a and 15b) and active base region provides a self-aligning feature of considerable advantage over prior art structures. Prior art structures typically utilized one mask to define the active base region and a second mask to define the emitter region. The accuracy with which the second mask could be positioned was accordingly critical in determining minimum base and emitter areas. The importance of this substantial advantage of self-aligning masks, among the many advantages provided by this invention which have been discussed herein, is already well-known in the field of semiconductor manufacture. See, e.g., U.S. Pat. No. 3,873,989 entitled "Double-Diffused, Lateral Transistor structure" and issued to Schinella and Anthony on March 25, 1975.

When ion implantation techniques are being utilized to form base resistors in the semiconductor structure, the thickness of the layer 21a, 21b, and 21c of first material can be chosen to obtain the desired concentration and penetration of impurity ions. For example, a layer 3000 Angstroms thick has been observed to produce satisfactory base resistors when boron ions are implanted with 160 Kilovolts energy.

Once layers 21a, 21b, and 21c of first material is formed on the underlying semiconductor material, a layer 22a, 22b, and 22c of second material is formed over selected regions of underlying material. In one embodiment a layer 22a, 22b, and 22c of second material is formed from photoresist and then removed from those regions where it is not desired. Typically, the layer 22a, 22b, and 22c of second material is allowed to remain wherever no impurity ions are desired in the substrate, e.g., regions overlying selected vertical transistor bases (22c) epitaxial resistors (22b), or other components (22a). By properly selecting the energy level for ion implantation, layer thickness, and the layer composition, nearly all impurity ions will be stopped before reaching the substrate in those regions on which the layer of second material is deposed; that is, those regions directly beneath layers 22a, 22b, and 22c, will receive very few impurity ions.

Having formed layers 21a, 21b, 21c, 22a, 22b, and 22c in the desired configurations, the impurity ions may be implanted in the previously selected locations, 30, 30a, 30b, and 30c. This semiconductor structure is shown in FIG. 2a. Note that impurity ions are more deeply implanted in region 30a where no overlying materials were formed than in regions 30b of 30c where layer 21b is present. Further, those regions over which layer 22 was formed received few impurity ions, as all or nearly all were stopped by the second material.

The process of this invention also allows formation of vertical transistors with different betas whenever this feature is desired in a circuit. This is illustrated in FIGS. 2a and 2b. By defining emitter 15b but then covering surface 16 with second material 22c, impurity ions are not allowed to penetrate into region 12c as they are at region 30a. In this manner a second vertical transistor having a greater beta than that of the transistor at region 12a is formed.

The completed semiconductor structure is shown in FIG. 2b. This structure is obtained by processing the structure of FIG. 2a in the following manner:

After ion implantation into regions 30a, 30b, and 30c:

Remove layers 22a, 22b, and 22c;

diffuse emitters 15a and 15b;

mask contact cuts (FIG. 2b) openings in layer 21 for contacts 33, 35, 36, 37, and 38. The opening for contacts 34 and 39 remain from portion masking of layer 21.

deposit metal interconnect layer and mask interconnect pattern (FIG. 2c, 33 through 39).

The structure shown in FIG. 2b includes a first NPN transistor emitter 34, base 35, and collector 33 contacts) a second NPN transistor (emitter 39, contacts to base 12c and collector 19d not shown), a base resistor (contacts 35 and 36), an epitaxial resistor (contacts 37 and 38), and diodes (contacts 34 and 35; 33 and 35).

Figure 3:
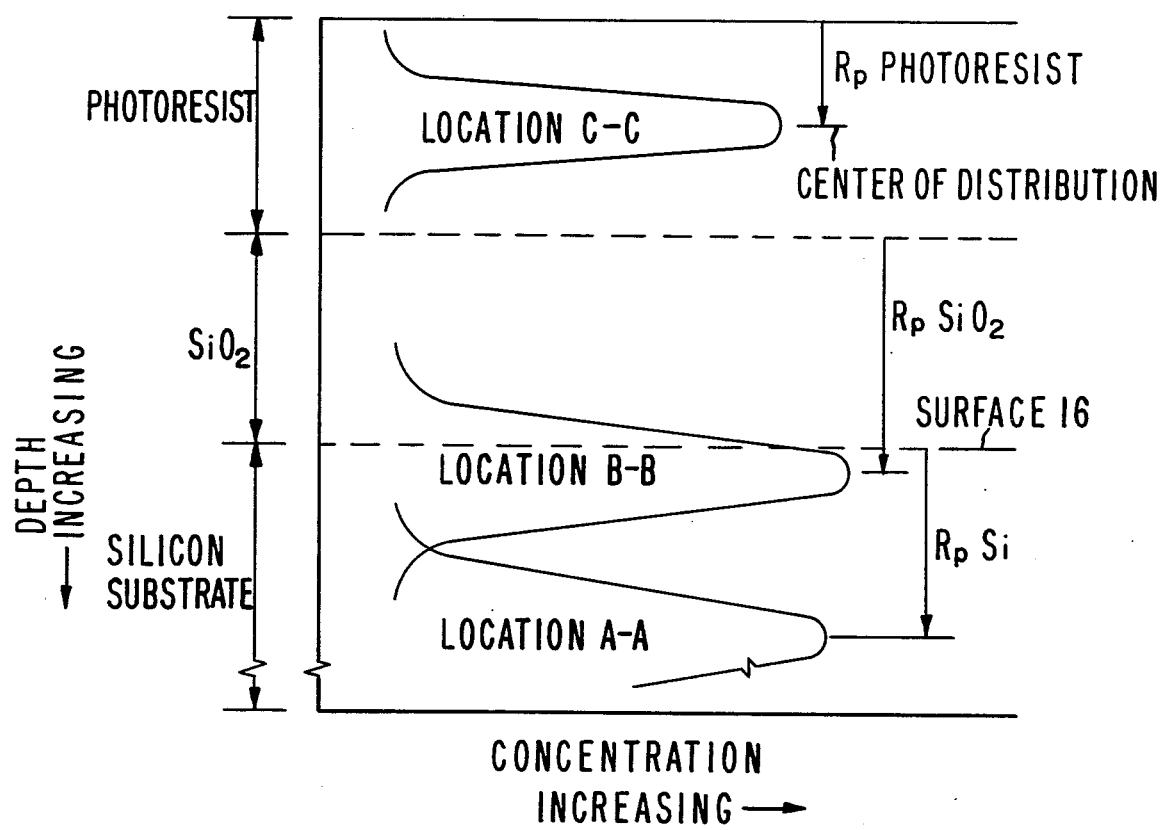

The concentration profiles at various locations in the structure of FIG. 2a are shown in FIG. 3. FIG. 3 shows the relationship of impurity ion concentration as a function of depth and location within the substrate when the first material is silicon dioxide and the second material is photoresist. Again note that at location A—A in FIG. 2a the impurity ions injected by ion implantation are able to penetrate into the substrate, achieving maximum concentration well below the substrate silicon dioxide interface. The range of peak concentration ($R_p$) of impurity ions is also desingated in FIG. 3.

At location B—B, the impurity ions, having already passed through the layer of first material, are not able to penetrate as deeply into the substrate, and most lodge near surface 16. The range of peak concentration of impurity ions at location B—B is designated $R_pSiO_2$. Finally, at location C—C all or nearly all of the ions are stopped by the layer of second material; in this case photoresist, and have a range of peak concentration designated $R_P$ photoresist.

Although the foregoing description often has been in terms of given conductivity type materials, the invention is not limited to the illustrated types. For example, it should be obvious that opposite conductivity type materials may be employed without changing the spirit and scope of the invention. That is, region 11 of FIG. 2a could have been formed from N type material, and all other regions formed from correspondingly opposite conductivity type material.

Finally, although this invention has been described in the context of oxide isolated integrated circuits, it should be understood that it could easily be applied to other types of integrated circuits, for example, those formed with isolation by mesa etching or by dielectric means to name only two.

I claim:

1. In the fabrication of semiconductor integrated circuits, the process of accurately defining base and emitter regions of bipolar transistors and eptiaxial resistors with a minimum of process steps comprising
   a. forming an epitaxial layer on a semiconductor substrate:
   b. forming upon selected regions of the surface of said epitaxial layer a layer of a first material with openings through said first layer where transistor emitters are to be formed;
   c. forming upon selected regions of said first material a layer of a second material;
   d. bombarding said epitaxial layer, said layer of first material, and said layer of second material with ions of selected energy, thereby doping surface regions of said epitaxial layer covered only by said first material and doping base regions within said epitaxial layer underlying said openings through said first material;
   e. removing said second material; and
   f. doping surface regions of said epitaxial layer within said openings, thereby defining emitter regions abutting said base regions.

2. The process of claim 1 wherein the energy level of the ions is selected to be low enough so that not all ions pass through into those regions of the semiconductor substrate upon which a layer of second material is formed, and the energy level of the ions is high enough so that nearly all ions penetrate into the semiconductor substrate in those regions of the substrate upon which there is neither a layer of first material nor a layer of second material.

3. The process of claim 2 wherein the energy level of the ions is selected to be high enough to allow the center of distribution of the ions to lodge in said semiconductor material in those regions of the semiconductor material on which only the layer of first material is disposed.

4. The process of claim 1 wherein said first material is an oxide of silicon.

5. The process of claim 1 wherein said second material is photoresist.

* * * * *